(12) United States Patent
Fuku et al.

(10) Patent No.: US 6,791,170 B1
(45) Date of Patent: Sep. 14, 2004

(54) ONBOARD SEMICONDUCTOR DEVICE

(75) Inventors: Masaru Fuku, Tokyo (JP); Hirotoshi Maekawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/419,787

(22) Filed: Oct. 18, 1999

(30) Foreign Application Priority Data

Apr. 22, 1999 (JP) .............................. 11-114718

(51) Int. Cl.[7] .............................................. H01L 23/48
(52) U.S. Cl. ...................... 257/678; 257/696; 257/735; 257/785; 257/734
(58) Field of Search ................................ 257/735, 678, 257/696, 785, 734, 341, 727, 726, 723, 724, 691, 707, 718, 500, 719, 698, 688; 336/132, 692, 738, 795, 784, 785; 361/736, 748

(56) References Cited

U.S. PATENT DOCUMENTS

| | | | | |
|---|---|---|---|---|
| 4,037,270 A | * | 7/1977 | Ahmann et al. | ............ 361/385 |
| 5,109,317 A | * | 4/1992 | Miyamoto et al. | ......... 165/80.3 |
| 5,136,471 A | * | 8/1992 | Inasaka | ....................... 361/414 |
| 5,747,875 A | * | 5/1998 | Oshima | ...................... 257/687 |
| 5,793,106 A | * | 8/1998 | Yasukawa et al. | .......... 257/712 |
| 6,181,590 B1 | * | 1/2001 | Yamane et al. | ............. 363/132 |

FOREIGN PATENT DOCUMENTS

| | | |
|---|---|---|
| AT | 310 286 | 1/1973 |
| DE | 31 16 410 | 2/1982 |
| DE | 35 30 827 | 3/1987 |
| DE | 41 11 912 | 10/1992 |
| DE | 92 10 221 | 11/1992 |
| DE | 196 47 229 | 2/1998 |
| EP | 0 290 617 | 11/1988 |
| EP | 0787992 A2 | 8/1997 |
| JP | 09-129766 | * 5/1997 |
| JP | 11087610 | * 3/1999 |
| JP | 411087610 | * 3/1999 |

OTHER PUBLICATIONS

Mitsubishi Denki Giho (vol. 72, No. 12, 1998).*
Mitsubishi Denki Giho (vol. 72, No. 12, 1998) with an English summary.

* cited by examiner

Primary Examiner—David E. Graybill
Assistant Examiner—James Mitchell
(74) Attorney, Agent, or Firm—Sughrue Mion, PLLC

(57) ABSTRACT

There is provided a high performance onboard semiconductor device with low manufacturing costs and low repair costs. The onboard semiconductor device includes a power chip substrate on which a power chip is mounted, a control substrate provided with an electrical part in relation to the power chip, and an outer enclosing case in which the power chip substrate and the control substrate are contained, and is characterized in that the control substrate and the outer enclosing case are removably fixed to each other.

3 Claims, 6 Drawing Sheets

ONBOARD SEMICONDUCTOR DEVICE

BACKGROUND OF THE INVENTION

1. Field of the Invention

The present invention relates to a semiconductor device as a main component of an onboard power inverter that controls an electric motor and the like. More particularly, the present invention is directed to a structure of a control substrate (circuit board) built in a semiconductor device of an onboard power apparatus that drives an AC power load from a DC power source, a connecting means or method between the control substrate and a power chip substrate, and a fixing means or method between the control substrate and an outer enclosing case.

2. Description of the Related Art

FIGS. 10 and 11 shows a structure of a semiconductor device called an intelligent power module (hereinafter also referred to as "IPM") which is conventionally used as a driving device of an onboard power inverter. FIG. 10 is a top view of a power portion of the IPM in which a control substrate 7 is removed, and FIG. 11 is a side sectional view of the IPM.

In the respective drawings, a power chip substrate (circuit board)5 generally made of an insulating material is attached onto a metal plate 1 that is fixed to an outer enclosing case 2 of a resin mold, and a power chip 6 is mounted on the power chip substrate 5 by solder or the like. Leads 9a and 9b both the other ends of which are insert-molded are electrically connected through wire bonding to the power chip 6 and the outer enclosing case 2. Incidentally, reference numeral 3 in the drawing designates an upper cover, and 4a and 4b designate main electrodes.

On the other hand, through holes 20a and 20b for electrical connection to the power chip 6 are provided in the control substrate 7 on which relevant electrical parts 8 such as driving/protecting/controlling circuits for the power chip 6 are mounted. Connection between the control substrate 7 and the power chip substrate 5 has been conducted by soldering the leads 9a and 9b to the through holes 20a and 20b.

In the foregoing related art, the leads 9a and 9b are soldered to the through holes 20a and 20b by means of manual soldering or a robot soldering apparatus. However, since the number of the leads 9a and 9b is large, it takes a long period of time for the assembling steps, which increases the assembling costs.

Further, when the semiconductor device was used in an onboard environment with a severe temperature cycle, solder cracks would often occur at their connection portions between the leads 9a and 9b and the through holes 20a and 20b.

Besides, in the foregoing structure of the related art, the leads 9a and 9b are soldered to the through holes 20a and 20b in the control substrate 7. Accordingly, in the case where the control substrate 7, the power chip substrate 5 or the like results in trouble for some reason or other, it is impossible to remove only this control substrate 7. As a result, it is necessary to exchange the whole semiconductor device, which increases the repair cost and is not economical.

SUMMARY OF THE INVENTION

The present invention has been made in view of the foregoing problems, and therefore has an object of the invention to provide a high performance onboard semiconductor device having high reliability, low manufacturing costs, and low repair costs, in which improvement is made in regard to electrical connection between a power chip substrate and a control substrate, and in regard to a fixing method between the control substrate and an outer enclosing case.

According to a first aspect of the invention, an onboard semiconductor device comprises a power chip substrate on which a power chip is mounted, a control substrate provided with an electrical part in relation to the power chip, and an outer enclosing case in which the power chip substrate and the control substrate are contained, and is characterized in that the control substrate and the outer enclosing case are removably fixed to each other.

According to a second aspect of the invention, in the onboard semiconductor device of the first aspect of the invention, it is characterized in that means for fixing the control substrate to the outer enclosing case is a pawl projectingly provided on the outer enclosing case.

According to a third aspect of the invention, in the onboard semiconductor device of the first aspect of the invention, it is characterized in that means for electrically connecting the power chip substrate to the control substrate includes a lead electrically connected to the power chip and fixed to the outer enclosing case, and a connector attached to the control substrate so as to be fitted to the lead.

According to a fourth aspect of the invention, in the onboard semiconductor device of the first aspect of the invention, it is characterized in that means for electrically connecting the power chip substrate to the control substrate includes a conductive material member electrically connected to the power chip and fixed to the outer enclosing case, a conductive land provided on the control substrate for connection with the power chip, and an elastic electrical connection material intervening between the conductive material member and the conductive land, and the control substrate is fixed to the outer enclosing case in a state where the electrical connection material is compressed.

According to a fifth aspect of the invention, in the onboard semiconductor device of the first aspect of the invention, it is characterized in that means for electrically connecting the power chip substrate to the control substrate includes a lead which is electrically connected to the power chip, a lower end portion of which is fixed to the outer enclosing case, and which is worked into a spring shape, and the control substrate is fixed to the outer enclosing case in a state where a tip side of the lead is compressed.

According to a sixth aspect of the invention, in the onboard semiconductor device of the first aspect of the invention, it is characterized in that means for fixing the control substrate to the outer enclosing case is a securing member like a screw.

DETAILED DESCRIPTION OF THE PREFERRED EMBODIMENTS

Embodiment 1

Figure 1:
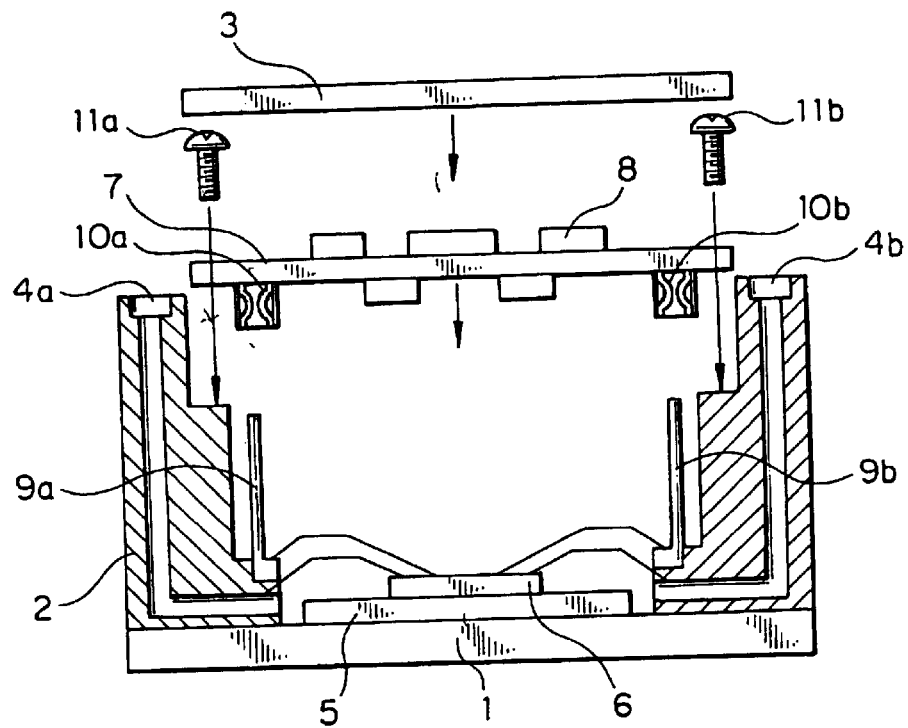
FIG. 1 is an assembling sectional view of an onboard semiconductor device according to a first embodiment of the present invention.
Figure 2:
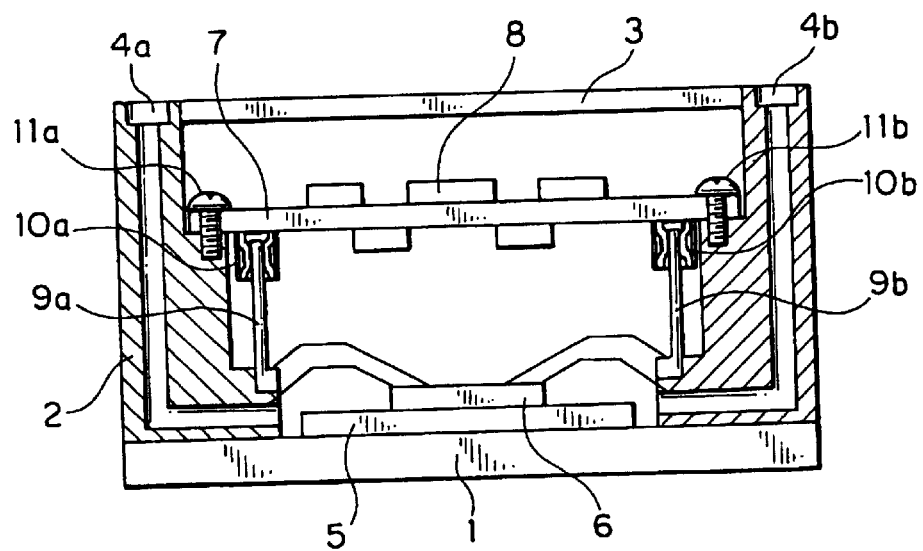
FIG. 2 is a sectional view of the onboard semiconductor device according to the first embodiment of the present invention.

In the embodiment shown in the drawings, a control substrate (circuit board)7 is removably fixed to an outer enclosing case 2 with a securing member so that it can be easily removed.

As the securing member, a screw, a bolt, a pin and the like are enumerated, and the screw is used in this embodiment.

A power chip substrate (circuit board)5 is attached onto a metal plate 1 fixed to the outer enclosing case 2 of a resin mold, and a power chip 6 is mounted on the power chip substrate 5. Leads 9*a* and 9*b* each one end of which is insert-molded to the outer enclosing case 2, are electrically connected to the power chip 6 through wire bonding. Incidentally, the power chip 6 may be any device such as an IGBT or MOSFET.

On the other hand, electrical parts 8 in relation to the power chip 6, such as a driving circuit, a protecting circuit, and a control circuit for driving/protecting/controlling the power chip 6, are mounted on both surfaces of the control substrate 7. Connectors 10*a* and 10*b* are attached to the control substrate 7. Although the connectors 10*a* and 10*b*, the electrical parts 8 and the like are mounted onto the control substrate 7 through flow soldering, reflow soldering or the like, it is also possible to mount them without a step that requires a long period of time such as manual soldering.

Fitting of the connectors 10*a* and 10*b* to the leads 9*a* and 9*b* is carried out in such a manner that the general connectors 10*a* and 10*b* in which a spring-like conductor with a female connector shape is contained in a housing of an insulator are used, and the respective leads 9*a* and 9*b* are inserted into the conductor so as to obtain electrical connection.

When the structure as described above is adopted, attachment of the control substrate 7 can be realized by merely pushing the control substrate 7 from above so that the leads 9*a* and 9*b* are fitted into the connectors 10*a* and 10*b*, and by merely fixing the control substrate 7 and the outer enclosing case 2 with screws 11*a* and 11*b* as securing means. Thus, as compared with the related art, a time period for manufacturing step can be greatly shortened and a reduction in manufacturing cost becomes possible.

Besides, in this first embodiment, as described above, since the connection between the power chip 6 and the control substrate 7 is conducted without using solder. Accordingly, even in an onboard environment with a severe temperature cycle, there is no possibility that solder cracks would occur as in the related art, and the reliability can be improved.

Further, when the control substrate 7 is removed, the control substrate 7 has only to be drawn out by hand after the screws 11*a* and 11*b* are removed. Thus, the control substrate 7 can be easily removed. With this, unified management of manufacture, inspection and the like can be carried out for a unit of a component, so that standardization of each component becomes possible.

Still further, even in the case where the control substrate 7 or the power chip substrate 5 develops trouble by some reason or others, it can be individually exchanged, so that a reduction in repair cost becomes possible.

Embodiment 2

Figure 3:
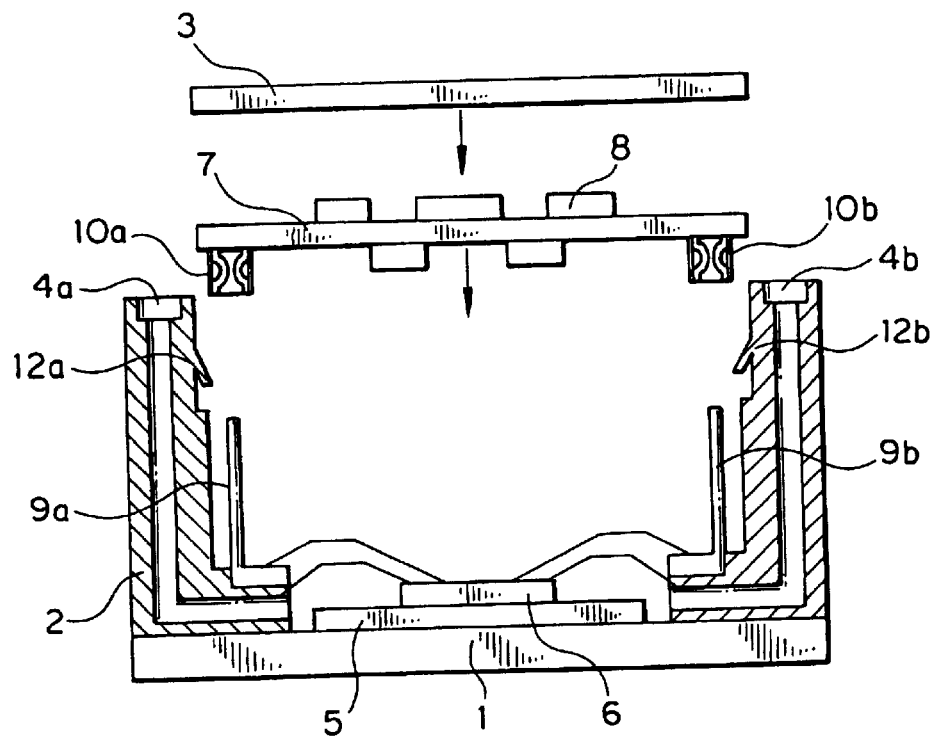
FIG. 3 is an assembling sectional view of an onboard semiconductor device according to a second embodiment of the present invention.
Figure 4:
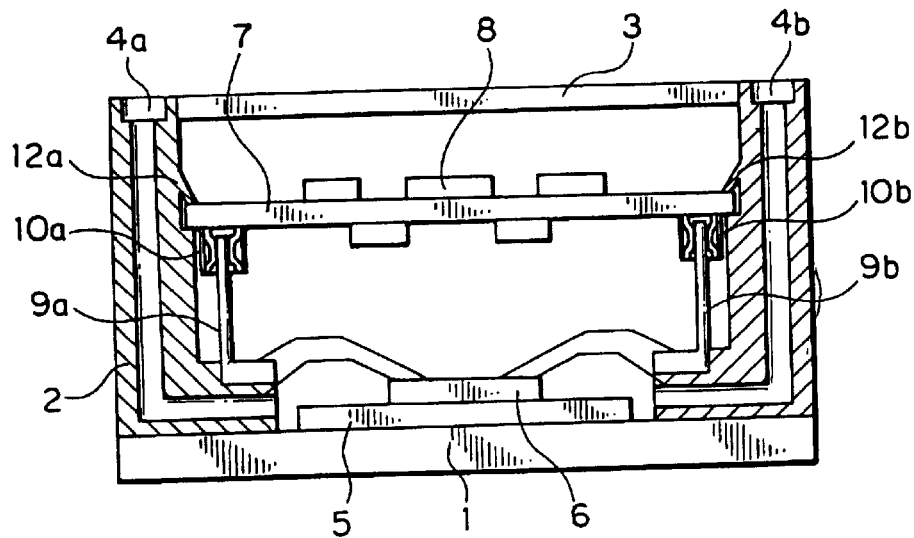
FIG. 4 is a sectional view of the onboard semiconductor device according to the second embodiment of the present invention.

A second embodiment relates to the second and third aspects of the invention recited in the Summary of the Invention section, and this will be described with reference to FIGS. 3 and 4. In the embodiment shown in the drawings, a control substrate 7 and an outer enclosing case 2 are removably fixed to each other with pawls. Pawls 12*a* and 12*b* shown in this embodiment are formed on side walls of the outer enclosing case 2 at the inner surface side so as to extend downward from above. When the control substrate 7 is pushed into the outer enclosing case 2, a part of an end face of the control substrate 7 butts against an outer surface of each of the pawls 12*a* and 12*b*, and slides downward while pressing. When the part passes through the pawls 12*a* and 12*b*, the pawls 12*a* and 12*b* are restored, so that the control substrate 7 is prevented from slipping out, and is attached to the outer enclosing case 2 and is fixed.

Like this, attachment of the control substrate 7 is carried out in such a manner that the control substrate 7 is pushed from above to the lower side of the pawls 12*a* and 12*b* provided on the outer enclosing case 2 like projections, thereby being fixed to the outer enclosing case 2. Thus, an assembling operation can be made extremely quickly and easily, and a time period for the manufacturing step can be remarkably shortened, so that manufacturing costs can be greatly reduced.

Besides, the control substrate 7 can be drawn out while the pawls 12*a* and 12*b* are pushed, so that similarly to the first embodiment, unified management for a unit of each component and a reduction in repair cost becomes possible.

Embodiment 3

A third embodiment relates to the second and fourth aspect of the invention recited in the Summary of the Invention section, and this will be described with reference to FIGS. 5 to 7.

Figure 5:
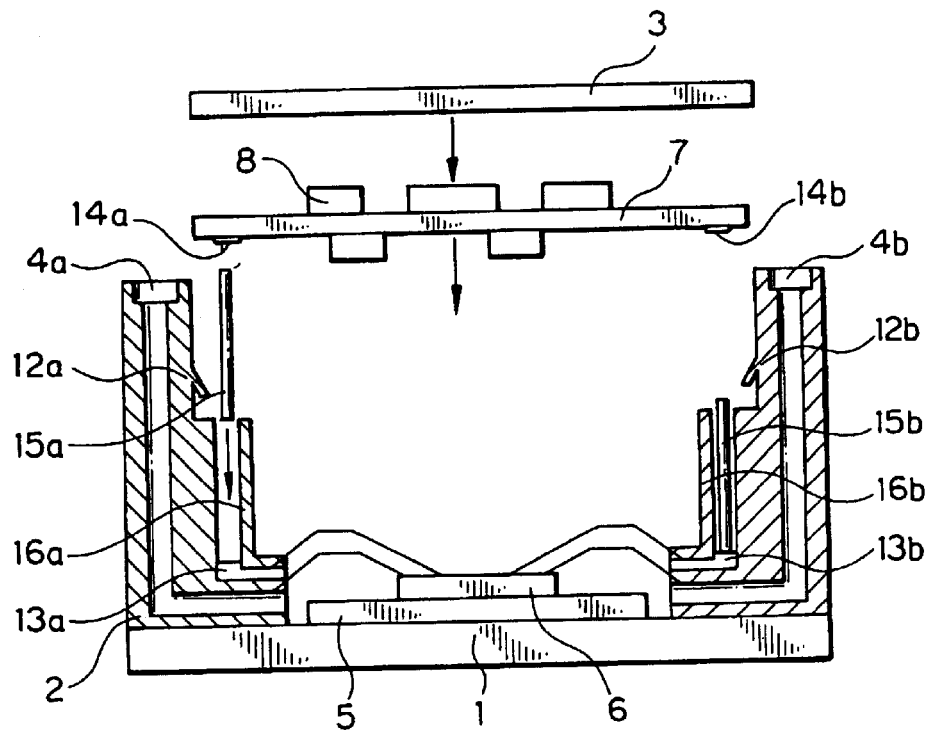
FIG. 5 is an assembling sectional view of an onboard semiconductor device according to a third embodiment of the present invention.
Figure 6:
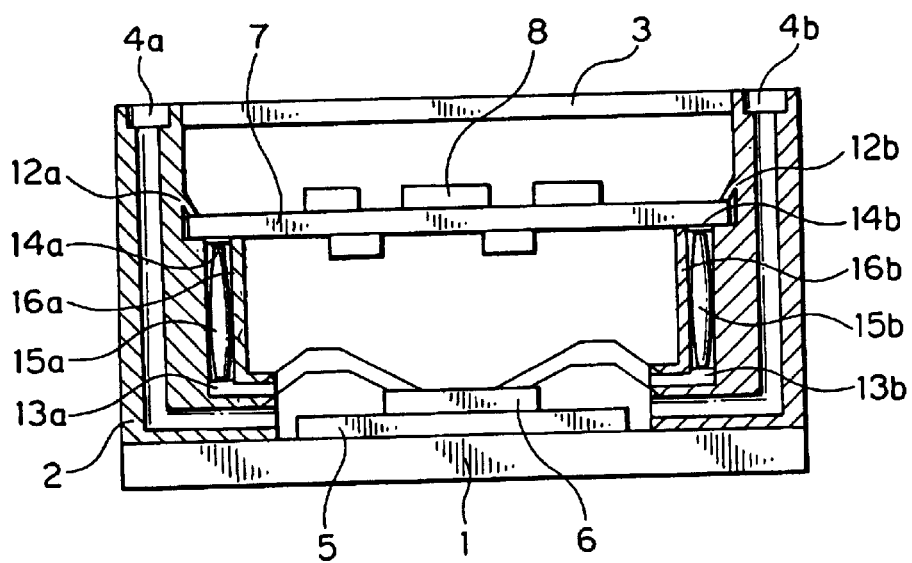
FIG. 6 is a sectional view of the onboard semiconductor device according to the third embodiment of the present invention.

In FIGS. 5 and 6, flat portions 13*a* and 13*b* of conductive material members which are insert-molded to an outer enclosing case 2, are electrically connected to a power chip 6 through wire bonding. On the other hand, a control substrate 7 is provided with conductive lands 14*a* and 14*b* for electrical connection to the power chip 6.

Electrical connection between the flat portions 13*a* and 13*b* of the conductive material members and the conductive lands 14*a* and 14*b* is conducted through elastic electrical connection materials 15*a* and 15*b*. Each of the electrical connection materials 15*a* and 15*b* shown in this embodiment is constructed such that an insulator 17 of elastic material and conductors 18 form a sandwich structure.

Figure 7:
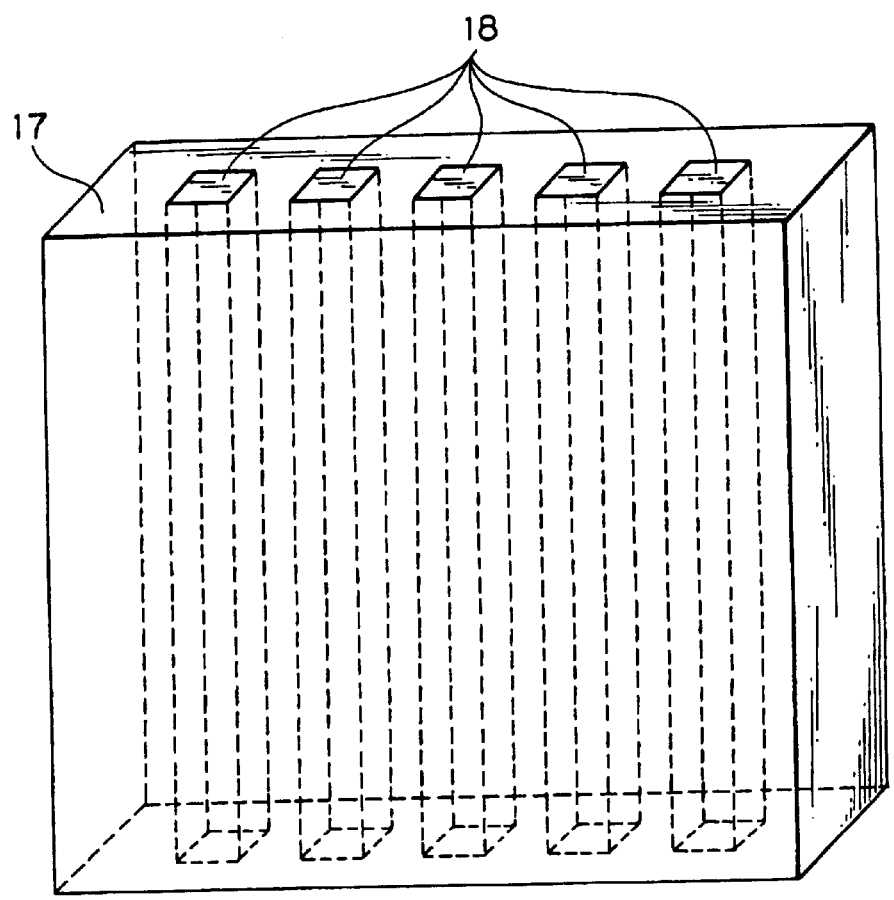
FIG. 7 is a perspective view of an electrical connection material according to the third embodiment of the present invention.

FIG. 7 is an enlarged view showing an example of the electrical connection materials 15a and 15b. The electrical connection materials 15a and 15b have the same structure as a flexibility connector generally used in a liquid crystal module and the like. Each of the conductors 18 transmitting electric signals is covered with the insulator 17.

The electrical connection materials 15a and 15b before being assembled shown in FIG. 5 are formed in slightly longer than the distance, that is, the interval between the conductive lands 14a and 14b positioned above and the flat portions 13a and 13b of the conductive material members positioned below as shown in FIG. 6. Thus, as shown in the drawing, when the control substrate 7 is attached, the electrical connection materials come to have a compressed state at all times.

Since the compressed electrical connection materials 15a and 15b naturally exert repulsive force to extend, the electrical connection materials 15a and 15b, the flat portions 13a and 13b of the conductive material members, and the conductive lands 14a and 14b come to have such a state that they are always pressed by a constant force. With this, excellent electrical connection between the power chip 6 and the control substrate 7 can be obtained.

Attachment of the control substrate 7 is carried out in such a manner that as shown in FIG. 5, the electrical connection materials 15a and 15b are inserted from above along guides 16a and 16b, and the control substrate 7 is pushed to the lower side of the pawls 12a and 12b, so that the control substrate is fixed to the outer enclosing case 2. Fixation between the control substrate 7 and the outer enclosing case 2 may be made by something other than the pawls For example, like the foregoing embodiment, the control substrate may be removably fixed by using a suitable securing member.

Embodiment 4

A fourth embodiment relates to the second and fifth aspects of the invention recited in the Summary of the Invention section, and this will be described with reference to FIGS. 8 and 9.

Figure 8:
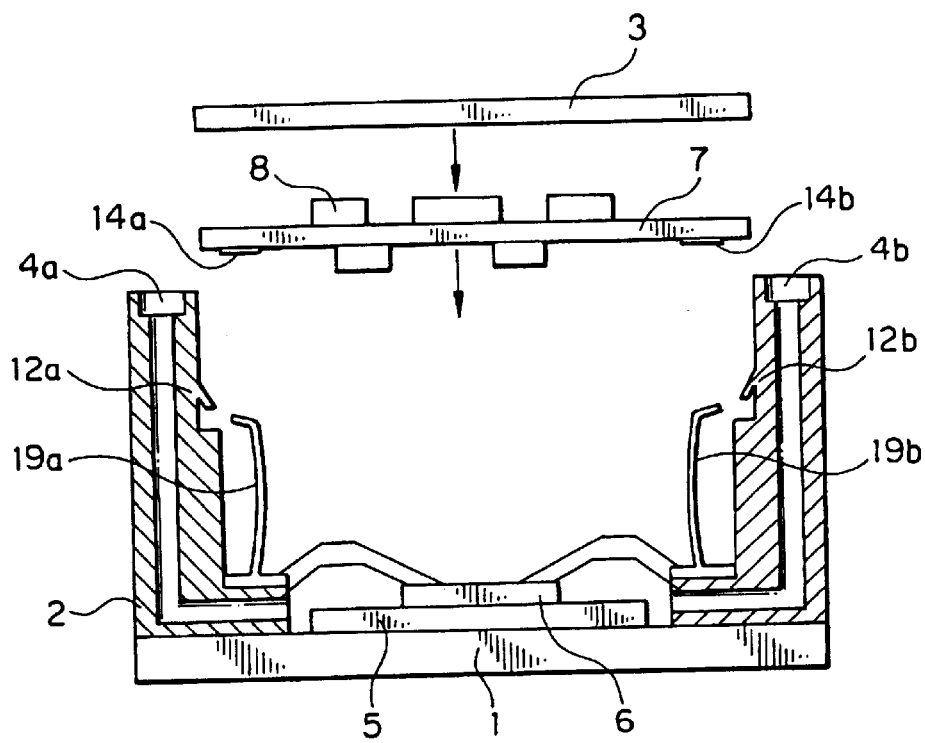
FIG. 8 is an assembling sectional view of an onboard semiconductor device according to a fourth embodiment of the present invention.

In FIG. 8, spring leads 19a and 19b are electrically connected to a power chip 6 through wire bonding, and are formed respectively in such a manner that a lead with a lower end which is insert-molded to an outer enclosing case 2 is raised upwardly and is worked into a spring shape so as to produce an elastic force. Tip portions of the leads, that is, the spring leads 19a and 19b are bent such that when a control substrate 7 is attached to the outer enclosing case 2, the tip portions are always in contact with conductive lands 14a and 14b of the control substrate 7 while their tip sides are pressed.

Figure 9:
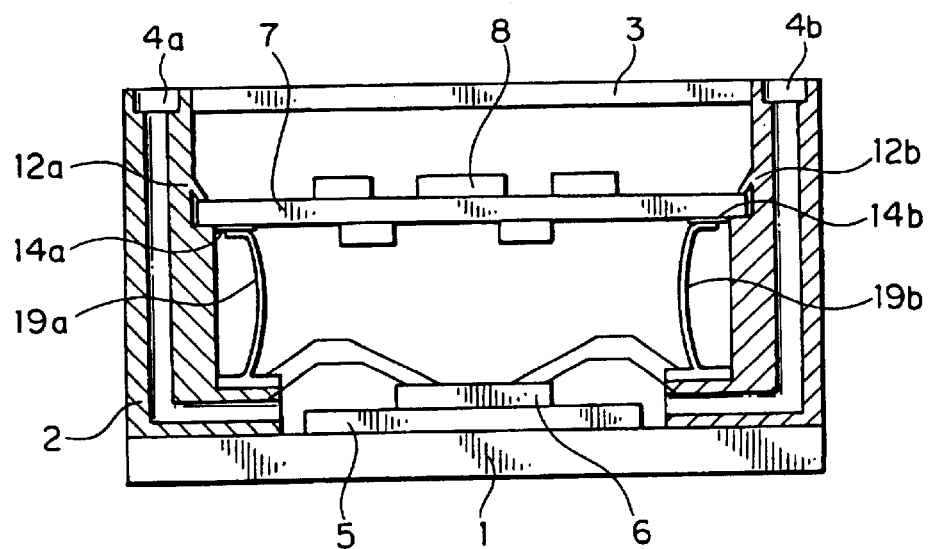
FIG. 9 is a sectional view of the onboard semiconductor device according to the fourth embodiment of the present invention.
Figure 10:
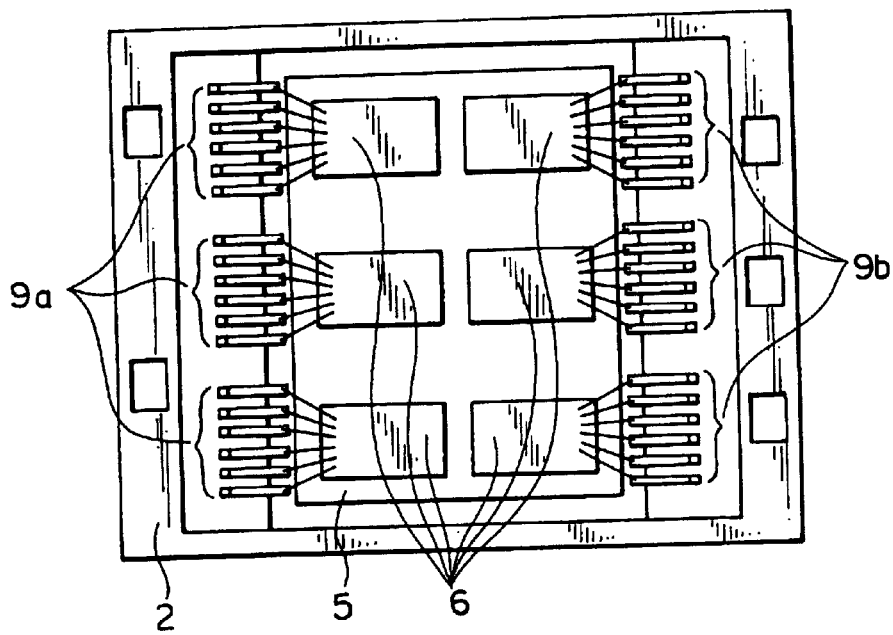
FIG. 10 is a top view of a power portion of a conventional onboard semiconductor device.
Figure 11:
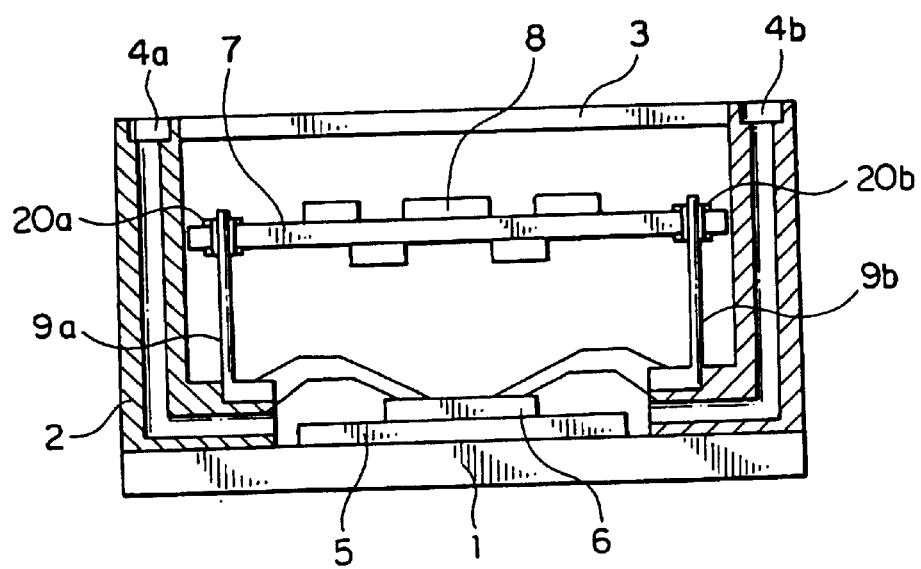
FIG. 11 is a sectional view of the conventional onboard semiconductor device.

As shown in FIG. 9, when the control substrate 7 is attached, the spring leads 19a and 19b come to have a compressed state. Thus, since the spring leads 19a and 19b come to have such a state that they exert repulsive force to extend, the spring leads 19a and 19b and the conductive lands 14a and 14b are always brought into press contact with each other by a constant spring pressure. Thus, excellent electrical connection between the power chip 6 and the control substrate 7 can be obtained.

The present invention has the following effects.

According to the first to sixth aspects of the invention, since the control substrate is removably structured, attachment of the control substrate can be conducted only if the control substrate is pushed in the outer enclosing case and is fixed, or after the control substrate is pushed in the outer enclosing case, it has only been removably fixed with a suitable securing member, for example, a screw. Thus, a long period of time for a manufacturing step is not required as in the related art, but assembly of the semiconductor device can be extremely quickly and easily made, so that manufacturing costs can be greatly reduced.

Besides, by only drawing out the control substrate or by removing the securing member and drawing out the control substrate, the control substrate can be easily removed. Thus, in the case where a control circuit of a power inverter or a system structure is changed, that is, exchanged for a unit of an objective system, the circuit structure of the control substrate alone has only to be exchanged, and the power chip substrate can be commonly used as it is, which is economical.

Besides, standardization of each component at mass production can be achieved, and manufacture, inspection and the like can be made at individual assembling lines. Thus, selection of a factory and unified management for a unit of each component become possible, and a semiconductor device with high reliability can be provided.

Besides, in the case where the control substrate or the power chip substrate develops trouble by some reason and others, the trouble can be settled by exchange of the breakdown part alone, so that repair costs can be reduced.

According to the second and sixth aspect of the invention, for example, a moisture-resistant coating material is attached to the control substrate, and the control substrate is removably fixed with the securing member such as a pawl or a screw. Thus, the invention can satisfy environment-resistant characteristics of moisture resistance and vibration resistance comparable to or superior to that of the related art.

Hence, since removal of the control substrate is not taken into consideration in the conventional semiconductor device, a resin is sealed up to the upper surface of the control substrate for countermeasure against moisture resistance and vibration resistance. On the contrary, such sealing of a resin becomes unnecessary in the present invention, so that manufacturing costs can be greatly reduced.

Besides, according to the third to fifth aspects of the invention, since it is not necessary to use solder for electrical connection between the power chip substrate and the control substrate, as compared with conventional soldering connection, a time period for a manufacturing step is remarkably shortened, and manufacturing costs can be greatly reduced.

Besides, even under the environment with a severe temperature cycle, such as an onboard environment, since solder cracks do not occur, as compared with the related art, the reliability of the onboard semiconductor device, and the reliability of the onboard power inverter using this semiconductor device can be remarkably improved.

Incidentally, in the foregoing embodiments, although examples in which electrical parts are mounted on both surfaces of the control substrate have been shown, if there is a fear that the control substrate would receive the influence of switching noise of the power chip, the electromagnetic noise can be easily shielded by inserting a shielding plate made of a copper plate or the like between the control substrate and the power chip.

What is claimed is:

1. An onboard semiconductor device comprising:
   a power chip circuit board on which a power chip is mounted;
   a control circuit board having mounted thereon an electrical component in relation to said power chip;

an outer case in which said power chip circuit board and the control circuit board are contained; and means for electrically connecting the power chip circuit board to the control circuit board, wherein the connecting means includes a lead electrically connected to the power chip and fixed to the outer case, and a connector attached to the control circuit board, so as to be fitted to the lead;

wherein the control circuit board and the outer case are removably fixed to each other.

2. An onboard semiconductor device comprising:

a power chip circuit board on which a power chip is mounted;

a control circuit board having mounted thereon an electrical component in relation to said power chip;

an outer case in which said power chip circuit board and the control circuit board are contained; and means for electrically connecting the power chip circuit board to the control circuit board, wherein the connecting means includes a conductive material member electrically connected to the power chip and fixed to the outer case, a conductive land provided on the control circuit board for connection with the power chip, and an elastic electrical connection material intervening between the conductive material member and the conductive land, and the control circuit board is fixed to the outer case in a state where the electrical connection material is compressed;

wherein the control circuit board and the outer case are removably fixed to each other.

3. An onboard semiconductor device comprising:

a power chip circuit board on which a power chip is mounted;

a control circuit board having mounted thereon an electrical component in relation to said power chip;

an outer case in which said power chip circuit board and the control circuit board are contained; and means for electrically connecting the power chip circuit board to the control circuit board, wherein said connecting means includes a lead that is electrically connected to the power chip, a lower end portion of which is fixed to the outer case, and which is formed into a spring shape, and the control circuit board is fixed to the outer enclosing case in a state where a tip side of the lead is compressed;

wherein the control circuit board and the outer case are removably fixed to each other.

* * * * *